United States Patent
Higuchi et al.

(10) Patent No.: US 7,932,948 B2
(45) Date of Patent: Apr. 26, 2011

(54) SOLID-STATE IMAGE SENSING DEVICE HAVING A LAYER ON MICROLENS AND METHOD FOR FABRICATING THE SAME

(75) Inventors: Toshihiro Higuchi, Osaka (JP); Tomoko Komatsu, Kyoto (JP); Tomoki Masuda, Osaka (JP); Mamoru Honjo, Osaka (JP); Naoki Tomoda, Shiga (JP)

(73) Assignee: Panasonic Corporation, Osaka (JP)

( * ) Notice: Subject to any disclaimer, the term of this patent is extended or adjusted under 35 U.S.C. 154(b) by 1176 days.

(21) Appl. No.: 11/488,627

(22) Filed: Jul. 19, 2006

(65) Prior Publication Data

US 2007/0030380 A1    Feb. 8, 2007

(30) Foreign Application Priority Data

Jul. 20, 2005 (JP) ................................. 2005-210383
Nov. 18, 2005 (JP) ................................. 2005-333865

(51) Int. Cl.
*H04N 5/225* (2006.01)
*H04N 9/083* (2006.01)
*H01L 21/00* (2006.01)

(52) U.S. Cl. ............................ 348/340; 348/273; 438/72

(58) Field of Classification Search .................... 438/69, 438/70, 72; 348/229.1, 273, 276, 277, 340, 348/374
See application file for complete search history.

(56) References Cited

U.S. PATENT DOCUMENTS

| | | | |
|---|---|---|---|
| 5,593,913 A * | 1/1997 | Aoki ................................. | 438/69 |
| 6,583,438 B1 | 6/2003 | Uchida | |
| 6,753,557 B2 * | 6/2004 | Nakai ............................ | 257/233 |
| 6,903,395 B2 * | 6/2005 | Nakai et al. .................... | 257/294 |
| 7,064,405 B2 * | 6/2006 | Kondo et al. ................... | 257/436 |
| 7,619,678 B2 * | 11/2009 | Komatsu et al. ............... | 348/340 |
| 2001/0040263 A1 * | 11/2001 | Nakai ............................ | 257/432 |
| 2005/0062871 A1 * | 3/2005 | Nishida et al. ................ | 348/340 |
| 2007/0058068 A1 * | 3/2007 | Fukuyoshi et al. ........... | 348/335 |
| 2009/0206435 A1 * | 8/2009 | Fukuyoshi et al. ........... | 257/432 |

FOREIGN PATENT DOCUMENTS

| | | |
|---|---|---|
| JP | 61-289772 A | 12/1986 |
| JP | 62-273768 A | 11/1987 |
| JP | 4-246859 A | 9/1992 |
| JP | 4-275459 A | 10/1992 |
| JP | 7-28014 | 3/1995 |
| JP | 7-54974 | 6/1995 |
| JP | 2719238 | 11/1997 |
| JP | 2942369 | 6/1999 |

(Continued)

OTHER PUBLICATIONS

Young, Andrew T.; "Refraction"; <http://mintaka.sdsu.edu/GF/explain/optics/refr.html>; 2002-2009; printed on Apr. 19, 2010.*

(Continued)

*Primary Examiner* — John M Villecco
(74) *Attorney, Agent, or Firm* — McDermott Will & Emery LLP

(57) ABSTRACT

A solid-state image sensing device comprises: a light receiving unit for receiving light; a microlens formed above the light receiving unit; a fluorine-containing resin material layer formed on the microlens; and a transparent substrate provided over the fluorine-containing resin material layer. A resin layer adheres the fluorine-containing resin material layer and the transparent substrate.

74 Claims, 10 Drawing Sheets

FOREIGN PATENT DOCUMENTS

| | | |
|---|---|---|
| JP | 2000-357786 | 12/2000 |
| JP | 2003-031782 | 1/2003 |
| JP | 2004031532 A * | 1/2004 |
| JP | 2004094007 A * | 3/2004 |
| JP | 2004335598 A * | 11/2004 |
| JP | 2005-51518 A | 2/2005 |
| JP | 2005197392 A * | 7/2005 |

OTHER PUBLICATIONS

Wagner, DJ and Rensselaer Polytechnic Institute; "The Speed of Light and the Index of Refraction"; 1999; <http://www.rpi.edu/dept/phys/Dept2/APPhys1/optics/optics/node4.html>.*

Japanese Office Action, with English translation, issued in Japanese Patent Application No. 2005-333865, dated Aug. 18, 2009.

* cited by examiner

FIG. 4

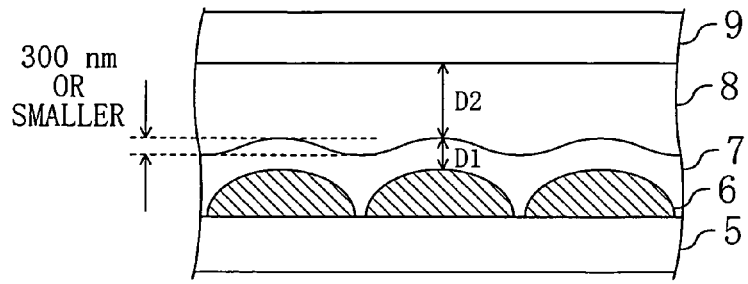

FIG. 5

| | n1 | n2 | n3 | n4 | LIGHT CAPABLE OF PASSING THROUGH MICROLENS (LIGHT COMING IN GLASS IS CONSIDERED AS 100%) |
|---|---|---|---|---|---|
| CONVENTIONAL SOLID-STATE IMAGE SENSING DEVICE 1 | 1.65 | 1 | 1 | 1.52 | 90% |
| CONVENTIONAL SOLID-STATE IMAGE SENSING DEVICE 2 | 1.65 | 1.41 | 1 | 1.52 | 92% |
| SOLID-STATE IMAGE SENSING DEVICE 1 OF THE PRESENT INVENTION | 1.65 | 1.41 | 1.26 | 1.52 | 98% |
| SOLID-STATE IMAGE SENSING DEVICE 2 OF THE PRESENT INVENTION | 1.65 | 1.41 | 1.46 | 1.52 | 99% |
| SOLID-STATE IMAGE SENSING DEVICE 3 OF THE PRESENT INVENTION | 1.65 | 1.41 | 1.66 | 1.52 | 99% |

FIG. 6

| | n1 | n2 | n3 | n4 | SENSITIVITY (SENSITIVITY OF CONVENTIONAL DEVICE IS CONSIDERED AS 100) |
|---|---|---|---|---|---|
| CONVENTIONAL SOLID-STATE IMAGE SENSING DEVICE | 1.65 | 1 | 1 | 1.52 | 100 |
| SOLID-STATE IMAGE SENSING DEVICE OF THE PRESENT INVENTION | 1.65 | 1.41 | 1.50 | 1.52 | 111 |

US 7,932,948 B2

SOLID-STATE IMAGE SENSING DEVICE HAVING A LAYER ON MICROLENS AND METHOD FOR FABRICATING THE SAME

BACKGROUND OF THE INVENTION (a) Fields of the Invention

The present invention relates to solid-state image sensing devices having a solid-state image sensing element and a transparent substrate for protecting the element, and to their fabrication methods.

(b) Description of Related Art

In a solid-state image sensing device employing a CCD (Charge Coupled Device) and the like, the area of a photodiode serving as a light receiving unit has been decreasing by demands for downsizing and resolution enhancement thereof. Such a decrease in the area of the light receiving unit in turn degrades the light collection efficiency of the device. In order to make up for this degradation, a so-called microlens has come to be developed and then put into use. This microlens is typically made of resin and disposed above the light receiving unit formed on each pixel. The microlens refracts light not coming directly in the light receiving unit to collect the refracted light into the light receiving unit, thereby enhancing light collection efficiency to improve sensitivity.

FIGS. 15 and 16 show cross-sectional structures of a conventional solid-state image sensing device. Referring to FIG. 15, in the surface of a substrate 101 for a CCD-type solid-state image sensing element, a recess is provided on each pixel. At the bottom of the recess, a photodiode 102 is provided which converts an incoming light into an electrical signal. On the substrate 101 for the solid-state image sensing element, a first acrylic flattening film 103 is formed which flattens unevenness of the substrate surface. On the first acrylic flattening film 103, color filters 104 are formed to be associated with the photodiodes 102, respectively. On the color filters 104, a second acrylic flattening film 105 is formed which flattens unevenness generated due to gaps between the color filters 104. On the second acrylic flattening film 105, microlenses 106 are formed to be associated with the photodiodes 102, respectively.

Referring to FIG. 16, a solid-state image sensing element 113 is composed of the photodiodes 102, the color filters 104, the microlenses 106, and the like formed on the substrate 101 for the solid-state image sensing element. The solid-state image sensing element 113 is mounted inside a package 112, and the top of the package 112 is covered with a transparent substrate 109. As shown in FIG. 15, inside the package 112, an air space 110 is interposed between the solid-state image sensing element 113 and the back surface of the transparent substrate 109. As shown in FIG. 15, when light 111 transmits through the transparent substrate 109 to come in the microlenses 106, reflections occur on the top and bottom surfaces of the transparent substrate 109 and the top surfaces of the microlenses 106.

However, rapid downsizing of the device in recent years has made it difficult to secure sufficient sensitivity only by light collection from the microlenses. To overcome such a difficulty, a structure such that an antireflection film is formed on the microlenses is proposed (see Patent Document 1: Japanese Patent No. 2719238).

(Patent Document 2)

Japanese Examined Patent Publication No. 7-54974

(Patent Document 3)

Japanese Examined Patent Publication No. 7-28014

(Patent Document 4)

Japanese Patent No. 2942369

SUMMARY OF THE INVENTION

However, even in the case where the antireflection film is formed on the microlenses, the presence of the air space 110 between the solid-state image sensing element 113 and the transparent substrate 109 for protecting the element as shown in FIGS. 15 and 16 causes the following problems.

Specifically, a large amount of light 111 is reflected on the interface between the transparent substrate 109 and the air space 110, that is, on the contact surface of the transparent substrate 109 with the air space 110 (the surface thereof closer to the solid-state image sensing element 113), which limits enhancement of the sensitivity of the solid-state image sensing device.

Furthermore, as shown in FIG. 16, if the air space 110 is present between the transparent substrate 109 and the solid-state image sensing element 113, dust or the like remaining inside the package 112 moves onto pixels of the solid-state image sensing element 113 during delivery of the solid-state image sensing device. This disadvantageously changes some of conforming devices to defective ones.

Moreover, the presence of the air space 110 between the solid-state image sensing element 113 and the transparent substrate 109 limits downsizing (reduction in height) of the solid-state image sensing device.

In view of the foregoing, an object of the present invention is to stably provide a solid-state image sensing device having an enhanced sensitivity and a downsized dimension.

To attain the above object, a first solid-state image sensing device according to the present invention comprises: a light receiving unit for receiving light; a microlens formed above the light receiving unit; a fluorine-containing resin material layer formed on the microlens; and a transparent substrate provided over the fluorine-containing resin material layer. In this device, a resin layer adheres the fluorine-containing resin material layer and the transparent substrate.

Preferably, in the first solid-state image sensing device according to the present invention, the top surface of the fluorine-containing resin material layer has a different contour from the surface of the microlens.

Preferably, in the first solid-state image sensing device according to the present invention, when the refractive indices of the microlens, the fluorine-containing resin material layer, the resin layer, and the transparent substrate are set at $n1$, $n2$, $n3$, and $n4$, respectively, the following relations hold: $n3=(n2+n4)/2\pm0.2$ and $n1>n2$.

Preferably, in the first solid-state image sensing device of the present invention, when the refractive indices of the microlens and the fluorine-containing resin material layer are set at $n1$ and $n2$, respectively, the following relations hold: $n1>1.60$ and $n2<1.45$.

Preferably, in the first solid-state image sensing device of the present invention, the resin layer has a thickness of 2 μm or greater.

A first method for fabricating a solid-state image sensing device according to the present invention comprises the steps of: forming, above a light receiving unit for receiving light, a microlens having a first refractive index; forming, on the microlens, a fluorine-containing resin material layer having a second refractive index; forming, on the fluorine-containing resin material layer, a resin layer having a third refractive index; and providing, on the resin layer, a transparent substrate having a fourth refractive index.

Preferably, in the first method for fabricating a solid-state image sensing device according to the present invention, the fluorine-containing resin material layer is formed by spin coating.

Preferably, the first method for fabricating a solid-state image sensing device according to the present invention further comprises the step of subjecting the surface of the fluorine-containing resin material layer to oxygen plasma treatment.

The first solid-state image sensing device and its fabrication method according to the present invention, however, have been found to have the drawback: for the first solid-state image sensing device and its fabrication method, it is difficult to define the thickness of the resin layer serving as a layer for adhering the fluorine-containing resin material layer and the transparent substrate. To be more specific, in the case where adhesive is applied onto the fluorine-containing resin material layer and then the transparent substrate (a transparent protective member) is placed and pressed from above, it is difficult to control the thickness of the resin layer made of the adhesive to a desired value. To overcome this drawback, the inventors have found a new approach in which before formation of the resin layer, a spacer for defining the thickness of the resin layer is disposed around a light receiving area (a pixel area).

To be more specific, a second solid-state image sensing device according to the present invention comprises: a plurality of light receiving units provided in a predetermined region on a semiconductor substrate and receiving light; and a transparent substrate provided over the semiconductor substrate to cover the plurality of light receiving units. In this device, a resin layer adheres the semiconductor substrate and the transparent substrate, and the thickness of the resin layer is defined by the height of a spacer disposed around the predetermined region.

Preferably, in the second solid-state image sensing device of the present invention, the spacer is made of resin.

In the second solid-state image sensing device of the present invention, the spacer may be made of an inorganic material.

Preferably, in the second solid-state image sensing device of the present invention, the spacer is formed on the semiconductor substrate or on a flattening film lying on the semiconductor substrate.

Preferably, in the second solid-state image sensing device of the present invention, when the height of the spacer is set at $l_0$ [μm] and the thickness from the top surface of the semiconductor substrate to the bottom end of the spacer is set at $l_1$ [μm], the relation: $l_0 > 10$ [μm]$-l_1$ is satisfied.

Preferably, in the second solid-state image sensing device of the present invention, the predetermined region is quadrangular, and the spacer is provided along at least two facing sides of the predetermined region.

Preferably, the second solid-state image sensing device of the present invention further comprises an amplifier unit arranged around the predetermined region on the semiconductor substrate and amplifying a signal outputted from the plurality of light receiving units, the spacer is provided at least between the amplifier unit and the predetermined region, and the spacer is formed with an opening not to face the amplifier unit.

A second method for fabricating a solid-state image sensing device according to the present invention comprises the steps of: forming, in a predetermined region on a semiconductor substrate, a plurality of light receiving units for receiving light; providing a transparent substrate over the semiconductor substrate to cover the plurality of light receiving units; and adhering the semiconductor substrate and the transparent substrate with a resin layer. In this method, a spacer is disposed around the predetermined region before formation of the resin layer, and the height of the spacer defines the thickness of the resin layer.

Preferably, in the second method for fabricating a solid-state image sensing device according to the present invention, the spacer is formed using dry etching.

Preferably, in the second method for fabricating a solid-state image sensing device according to the present invention, the spacer is formed by applying photosensitive resin and then sequentially subjecting the resin to exposure and development.

With the present invention, the resin layer is interposed between the transparent substrate and a solid-state image sensing element composed of the light receiving unit, the microlens, the fluorine-containing resin material layer, and the like. In other words, unlike the conventional solid-state image sensing device, no air space is interposed between the transparent substrate and the solid-state image sensing element. Thus, the following effects can be exerted. That is to say, the phenomenon in which during delivery of the solid-state image sensing device, dust or the like moves from outside the solid-state image sensing element through the air space onto a pixel of the solid-state image sensing element is eliminated, so that the occurrence of defects resulting from this dust or the like can be completely prevented. Moreover, the reflectivity of light at the interface between the transparent substrate and the resin layer in the solid-state image sensing device of the present invention can be made smaller than that at the interface between the transparent substrate and the air space in the conventional solid-state image sensing device. Therefore, the sensitivity of the solid-state image sensing device can be enhanced. To be more specific, a decrease in the amount of reflected light between one side of the transparent substrate and the surface of the solid-state image sensing element can improve G-sensitivity (a wavelength of 550 nm) by about 8%. Furthermore, since the transparent substrate is directly adhered to the solid-state image sensing element, downsizing and reduction in height of the device can be attained as compared to the conventional solid-state image sensing device.

With the present invention, since the thickness of the resin layer is defined by the height of the spacer arranged around the area where the light receiving units are disposed (the pixel area), the thickness of the resin layer can be controlled to a desired value. Thus, for example, a thickened resin layer can attenuate α-ray, so that expensive, high-purity glass for α-ray attenuation does not have to be used as the transparent substrate. Consequently, fabrication costs can be reduced. Moreover, the spacer is provided along at least two facing sides of the pixel area in, for example, a quadrangular shape, which enables arrangement of the transparent substrate in parallel with the pixel area, that is, the image sensing surface. With this arrangement, in mounting the solid-state image sensing device of the present invention in a camera or the like, components can be installed using the top surface of the transparent substrate as the reference level. Therefore, the number of components installed between the reference level and a lens decreases as compared to the case where a member serving as the reference level is attached to the back surface of the package like the conventional solid-state image sensing device (see, for example, Patent Document 5: Japanese Unexamined Patent Publication No. 2005-51518). This reduces deviation of position for installing the components to improve the accuracy of image sensing. Furthermore, the arrangement of the transparent substrate in parallel with the pixel area, that is, the image sensing surface can certainly prevent color moiré, shading (non-uniform brightness), or the like. Moreover, the spacer is provided between the amplifier unit and the pixel area, and the spacer is formed with an opening not to face the amplifier unit. Thereby, when the transparent substrate is adhered with an adhesive serving as the resin layer to the fluorine-containing resin material layer, that is, to the semiconductor substrate, the spacer can inhibit a decrease in amplifier sensitivity due to the adhesive attaching to the amplifier unit.

As can be seen from the above, the present invention relates to solid-state image sensing devices having a solid-state image sensing element and a transparent substrate for protecting the element, and to their fabrication methods. When the present invention is applied to a CCD- or MOS-type image sensor or the like using a light-collecting microlens, or to a solid-state image sensing device to be mounted to a digital video camera, a digital still camera, a camera-equipped cellular telephone, or the like, a downsized solid-state image sensing device with high sensitivity can be provided stably at low cost. Accordingly, the present invention is very useful.

BRIEF DESCRIPTION OF THE DRAWINGS

FIG. 4 is a view for illustrating the thicknesses of a fluorine-containing resin material layer and a resin layer of the solid-state image sensing device according to the first embodiment of the present invention.

FIG. 5 is a table showing comparison of the amount of light reaching a microlens of the solid-state image sensing device between the first embodiment of the present invention and a conventional example.

FIG. 6 is a table showing comparison of the sensitivity of the solid-state image sensing device between the first embodiment of the present invention and the conventional example.

DETAILED DESCRIPTION OF THE PREFERRED EMBODIMENTS

First Embodiment

Hereinafter, a solid-state image sensing device and its fabrication method according to a first embodiment of the present invention will be described with reference to the accompanying drawings. Unless otherwise specified, the drawings illustrate the state of the device after a wafer is separated (diced) into the solid-state image sensing devices of individual element (chip) form.

Figure 1:
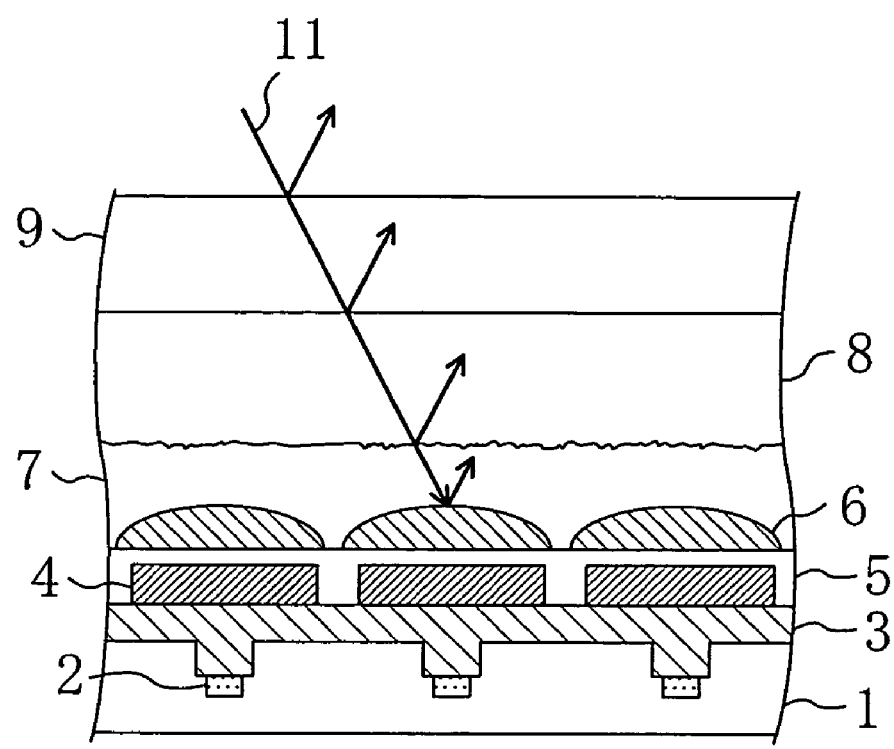
FIG. 1 is a sectional view of a solid-state image sensing device according to a first embodiment of the present invention.

FIG. 1 shows a cross-sectional structure of the solid-state image sensing device according to the first embodiment. FIG. 1 concurrently shows how light comes in microlenses of the solid-state image sensing device according to the first embodiment.

Referring to FIG. 1, in the surface of a substrate 1 for a CCD-type solid-state image sensing element, a recess is provided on each pixel. At the bottom of the recess, a photodiode 2 is provided which converts an incoming light into an electrical signal. On the substrate 1 for the solid-state image sensing element, a first acrylic flattening film 3 is formed which flattens unevenness of the substrate surface. On the first acrylic flattening film 3, color filters 4 are formed to be associated with the photodiodes 2, respectively. On the color filters 4, a second acrylic flattening film 5 is formed which flattens unevenness generated due to the color filters 4. On the second acrylic flattening film 5, microlenses 6 are formed to be associated with the photodiodes 2, respectively. The photodiodes 2, the color filters 4, the microlenses 6, and the like formed on the substrate 1 for the solid-state image sensing element constitute the solid-state image sensing element.

In the first embodiment, as the material for the microlens 6, use is made of, for example, a styrene-based positive type photosensitive resist using naphthoquinone diazide for a photosensitive base. Exposure with ultraviolet light or visible light improves the transmissivity of visible light range in naphthoquinone diazide to 80% or more. By subjecting this resist to thermal treatment at 120 to 280° C., the shape of the resist is becoming altered due to its thermoplasticity and simultaneously becoming fixed due to its thermosetting property. Finally, the difference between the extents of their changes determines the shape of the microlens 6 made of this resist.

Also, as shown in FIG. 1, by spin coating or the like, a layer made of a resin material containing fluorine (referred hereinafter to as a fluorine-containing resin material layer) 7 is formed to cover the microlenses 6. The fluorine-containing resin material layer 7 is subjected to surface treatment by, for example, oxygen plasma. Over the fluorine-containing resin material layer 7, a transparent substrate 9 is provided with a resin layer 8 interposed therebetween. The resin layer 8 adheres the transparent substrate 9 and the fluorine-containing resin material layer 7 lying on the solid-state image sensing element composed of the photodiodes 2, the microlenses 6, and the like. The transparent substrate 9 protects the solid-state image sensing element and seals the resin layer 8.

Note that as shown in FIG. 1, when light 11 transmits through the transparent substrate 9 to come in the microlenses 6, reflections occur on the top and back surfaces of the transparent substrate 9, the interface between the resin layer 8 and the fluorine-containing resin material layer 7, and the top surfaces of the microlenses 6.

A fabrication method of the above-shown solid-state image sensing device according to the first embodiment will be described below.

FIGS. 2A to 2F are sectional views showing process steps of the fabrication method of the solid-state image sensing device according to the first embodiment.

Figure 2A:
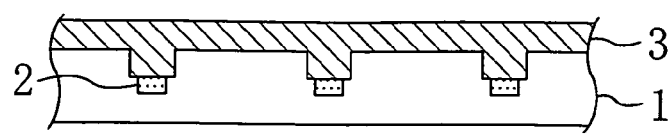
FIGS. 2A to 2F are sectional views showing process steps of a method for fabricating a solid-state image sensing device according to the first embodiment of the present invention.

Referring to FIG. 2A, first, for example, acrylic resin is applied by spin coating to the whole of an uneven surface of the substrate 1 for the solid-state image sensing element with the photodiode 2 provided on each pixel, and then the applied resin is heated and dried, for example, at about 180 to 250° C. and for about 60 to 600 seconds, thereby forming the first acrylic flattening film 3.

Figure 2B:
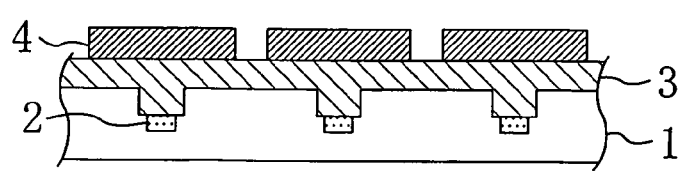

Next, as shown in FIG. 2B, on the first acrylic flattening film 3, the color filters 4 are formed to be associated with the photodiodes 2, respectively.

Figure 2C:
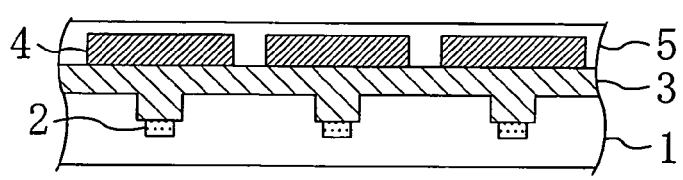

As shown in FIG. 2C, on the entire surfaces of the color filters 4, for example, acrylic resin is applied by spin coating to fill unevenness generated due to the color filters 4, and then the applied resin is heated and dried, for example, at about 180 to 250° C. and for about 60 to 600 seconds. In the first embodiment, such application and dry steps are repeatedly conducted, for example, twice to eight times to form the second acrylic flattening film 5 with a high flatness.

Figure 2D:
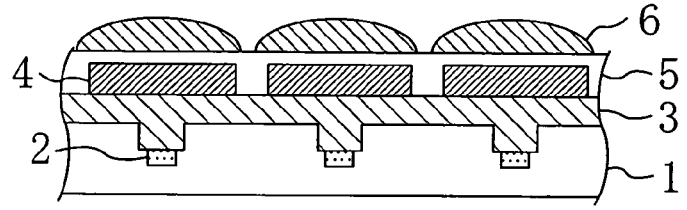

As shown in FIG. 2D, to the entire surface of the second acrylic flattening film 5, for example, a styrene-based positive type photosensitive resist is applied by spin coating to have a thickness of, for example, 0.5 µm or greater, and then the applied resist is dried, for example, at a low temperature of about 90 to 120° C. for about 10 to 600 seconds. Thereafter, the resist is subjected to, for example, selective exposure with i-line at an exposure energy of 100 to 1000 mJ. After this exposure, the resulting resist is developed using, for example, a TMAH (Tetramethyl Ammonium Hydroxide) solution to form a desired pattern made of remaining portions of the resist. Then, the remaining portions of the resist and the second acrylic flattening film 5 is subjected to overall exposure with g-line or light having a wavelength smaller than g-line and an exposure energy of 200 mJ or greater, whereby the visible-light transmissivity of the remaining portions of the resist is improved to 80% or higher. Subsequently, the remaining portions of the resist are heated, for example, at an intermediate temperature of about 120 to 180° C. for about 60 to 600 seconds. Thereby, both the thermoplastic and thermosetting performances of the remaining portion of the resist can be controlled, whereby the microlenses 6 are formed which have surfaces of a desired curvature and a predetermined refractive index (a first refractive index) n1. The microlenses 6 are subjected to thermal treatment, for example, at a high temperature of about 190 to 280° C. for about 60 to 600 seconds to improve the reliability of the microlens 6, to be more specific, the thermal resistance, the solvent resistance (the property resistant to alteration by solvent), and the like of the microlenses 6.

Figure 2E:
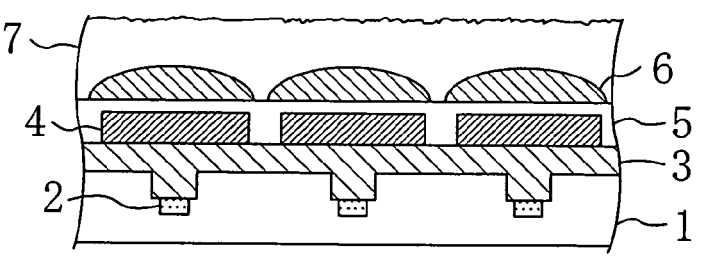

As shown in FIG. 2E, to the entire surface of the second acrylic flattening film 5 with the microlenses 6 provided thereon, a resin material containing fluorine is applied by spin coating to have a desired thickness equal to or more than 0.1 µm. During this application, in order not to curve the surface of the applied resin material in accordance with the curved surfaces of the microlenses 6, in other words, in order to provide the fluorine-containing resin material with a different surface contour from those of the microlenses 6, the spin coating is performed at a number of revolutions of, for example, about 500 to 5000 rpm (revolution per minute). Subsequently, in order to prevent intake of bubbles in the fluorine-containing resin material resulting from solvent bumping, the resin material is dried, for example, at a low temperature of about 90 to 120° C. for about 10 to 600 seconds. Then, to cure the fluorine-containing resin material, drying by heating is carried out, for example, at about 150 to 250° C. and about 60 to 600 seconds to form the fluorine-containing resin material layer 7 having a predetermined refractive index (a second refractive index) n2.

Note that in the case where there is no possibility of the above-mentioned intake of bubbles in the fluorine-containing resin material, the drying step at a low temperature (90 to 120° C.) described above may be omitted.

In the first embodiment, the sentence "not to curve the surface of the applied resin material, that is, the top surface of the fluorine-containing resin material layer 7 in accordance with the curved surfaces of the microlenses 6" means that "to prevent the state in which the fluorine-containing resin material layer 7 with a uniform thickness is formed on the entire surfaces of the microlenses 6 (see, for example, FIG. 3A)". In other words, the sentence means that as exemplarily shown in FIG. 3B, the surface of the microlens 6 has a curved contour while the top surface of the fluorine-containing resin material layer 7 has a contour different from that curved contour, for example, a flat contour.

Figure 3A:
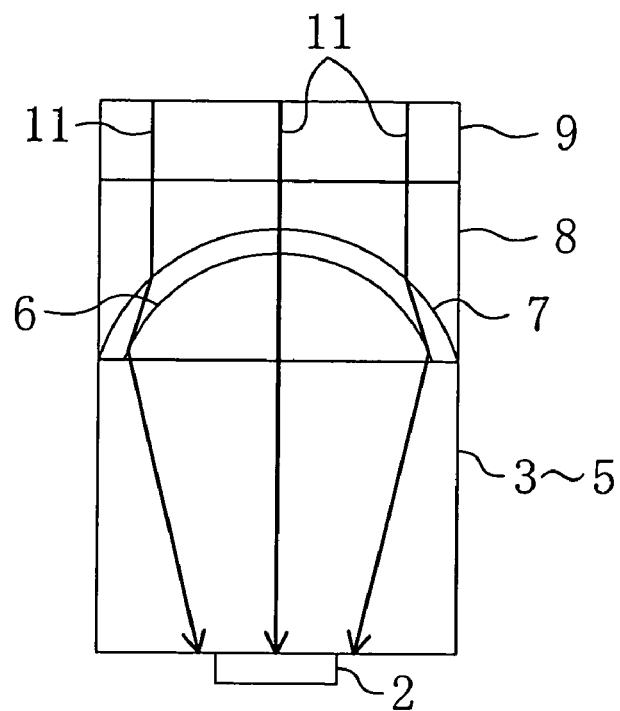
FIGS. 3A and 3B are views for illustrating the effect of improving the light collection efficiency of the solid-state image sensing device according to the first embodiment of the present invention.
Figure 3B:
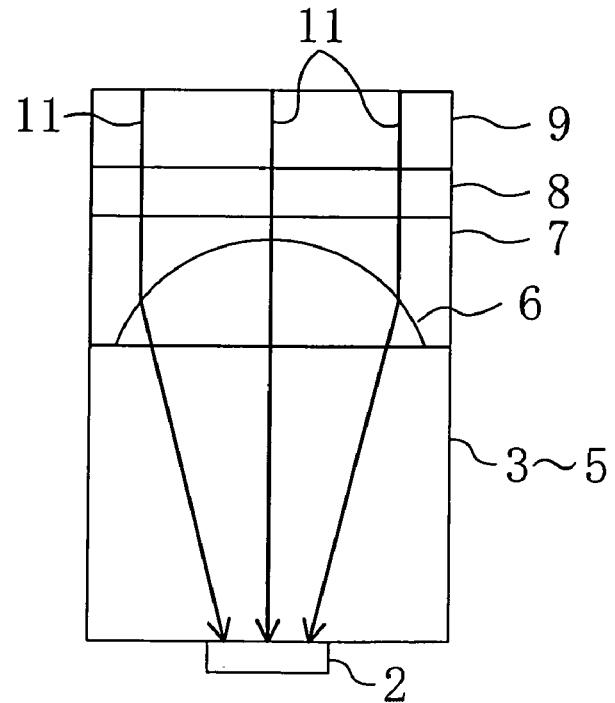

In the first embodiment, the thickness of the fluorine-containing resin material layer 7 indicates the thickness D1 of the fluorine-containing resin material layer 7 vertically extending on the top point (the highest position) of the microlens 6 as exemplarily shown in FIG. 4. Note that in FIGS. 3A, 3B, and 4, illustration of some components of the solid-state image sensing device of the first embodiment shown in FIG. 1 is deformed or omitted.

In the first embodiment, as the material for the fluorine-containing resin material layer 7, use can be made of, for example, acrylic-based resin, olefin-based resin, silicone-based resin, or the like. However, from the viewpoint of thermal resistance, preferable use is made of fluorine-containing silicone-based resin. To be more specific, a silicone-based resin material containing fluorine is used which is provided by, for example, Toray Industries, Inc. In addition, hollow microparticles of silicon dioxide ($SiO_2$) or metal oxide having a diameter, for example, less than 400 nm may be dispersed in the fluorine-containing resin material layer 7. Such dispersion can offer a more reduced refractive index of the fluorine-containing resin material layer 7.

Subsequently, after formation of the fluorine-containing resin material layer 7, for example, plasma treatment using a gas containing oxygen is performed on the surface of the fluorine-containing resin material layer 7 for about 5 to 500 seconds. With this treatment, alkyl-denatured siloxane bonding (—SiO—R (R: alkyl group)) existing in the uppermost surface of the fluorine-containing resin material layer 7 can be changed into —$SiO_x$. This results in a reliable resist application in the step of removing, by etch back using a positive type resist, an organic material layer which is provided on an electrode unit or an amplifier unit arranged outside the light receiving unit and which will become necessary later. Therefore, removal of the organic material layer on the electrode unit or the amplifier unit can be conducted stably. Moreover, the resin layer 8 can be formed uniformly in a later step, and the interface adhesion strength between the fluorine-containing resin material layer 7 and the resin layer 8 after curing of the resin layer 8 can be further enhanced. Consequently, a highly reliable solid-state image sensing device can be provided.

Figure 2F:
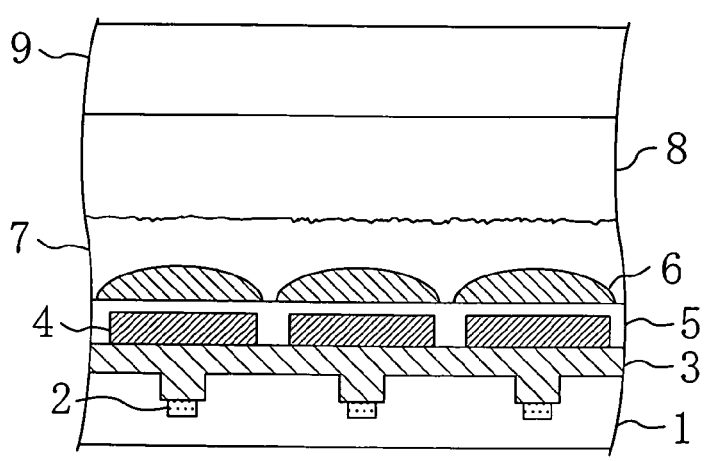

Next, as shown in FIG. 2F, to the fluorine-containing resin material layer 7 subjected to the plasma treatment, resin is applied to have a thickness of 2 μm or greater, thereby forming the resin layer 8 with a predetermined refractive index (a third refractive index) n3. Subsequently, in order to protect the solid-state image sensing element composed of the photodiodes 2, the color filters 4, the microlenses 6, and the like, the transparent substrate 9 with a predetermined refractive index (a fourth refractive index) n4 is placed on the resin layer 8. During this process, the resin layer 8 is cured to adhere the fluorine-containing resin material layer 7 and the transparent substrate 9.

In the first embodiment, the thickness of the resin layer 8 indicates, as exemplarily shown in FIG. 4, the thickness D2 of the resin layer 8 vertically extending on the top point (the highest position) of the microlens 6.

The material for the resin layer 8 is not specifically limited. In the first embodiment, acrylic-based resin provided by Nitto Denko Corporation was used. However, another epoxy resin or the like may be used instead of this.

Figure 15:
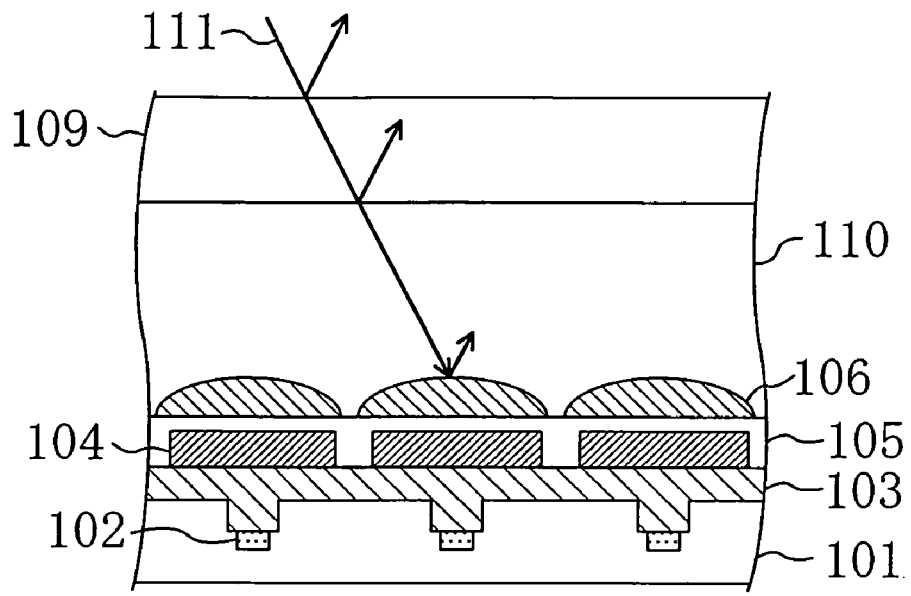
FIG. 15 is a sectional view of a conventional solid-state image sensing device.

Next description will be made of a characteristic of the solid-state image sensing device according to the first embodiment. As illustrated above, FIG. 15 shows how light comes in the microlens in the conventional solid-state image sensing device, while FIG. 1 shows how light comes in the microlens in the solid-state image sensing device of the first embodiment.

As shown in FIG. 1, in the solid-state image sensing device of the first embodiment, the resin layer 8 is interposed between the transparent substrate 9 and the solid-state image sensing element composed of the photodiodes 2, the color filters 4, the microlenses 6, the fluorine-containing resin material layer 7, and the like. In other words, unlike the conventional solid-state image sensing device (see FIG. 15), no air space is interposed between the transparent substrate and the solid-state image sensing element. Thus, the following effects can be exerted.

That is to say, the phenomenon in which during delivery of the solid-state image sensing device, dust or the like moves from outside the solid-state image sensing element through the air space onto a pixel of the solid-state image sensing element is eliminated, so that the occurrence of defects resulting from this dust or the like can be completely prevented. Note that in the solid-state image sensing device of the first embodiment shown in FIG. 1, dust or the like attaching onto the outer surface of the transparent substrate 9 (the surface thereof farther from the solid-state image sensing element) can be simply removed by a certain action such as wiping.

Moreover, the reflectivity of light at the interface between the transparent substrate 9 and the resin layer 8 in the solid-state image sensing device of the first embodiment can be made smaller than that at the interface between the transparent substrate 109 and the air space 110 in the conventional solid-state image sensing device. Therefore, the sensitivity of the solid-state image sensing device can be enhanced.

Furthermore, in the solid-state image sensing device of the first embodiment, the transparent substrate 9 is directly adhered to the solid-state image sensing element. Therefore, downsizing of the device can be attained as compared to the conventional solid-state image sensing device.

To be more specific, in the first embodiment, the refractive index (the first refractive index) of the microlens 6 is set at n1, the refractive index (the second refractive index) of the fluorine-containing resin material layer 7 is set at n2, the refractive index (the third refractive index) of the resin layer 8 is set at n3, and the refractive index (the fourth refractive index) of the transparent substrate 9 is set at n4. For these settings, if n3=(n2+n4)/2±0.2 and n1>n2, the amount of light capable of passing through the microlens 6 is 98% or more of the amount of light coming into the transparent substrate 9, as shown in FIG. 5. In other words, the amount of light lost before the light passes through the microlens 6 is 2% or smaller. On the other hand, for the conventional solid-state image sensing device, the amount of light lost before the light passes through the microlens 106 reaches about 10%.

In the solid-state image sensing device of the first embodiment shown in FIG. 5 (the solid-state image sensing devices 1 to 3 of the present invention), styrene-based resin (n1=1.65) is used as the material for the microlens 6, fluorine-containing silicone-based resin (n2=1.41) is used as the material for the fluorine-containing resin material layer 7, three types of acrylic-based resin differing in refractive index (n3=1.26, 1.46, and 1.66) are used as the material for the resin layer 8, and glass (n4=1.52) is used as the material for the transparent substrate 9. In this embodiment, it is needless to say that other materials capable of satisfying the above-shown equation representing the relation of refractive index can be used as the materials for the listed components. The conventional solid-state image sensing device 1 employed for comparison is made so that a transparent substrate (n4=1.52) similar to the transparent substrate 9 of the first embodiment is placed over microlenses similar to the microlenses 6 of the first embodiment with the air space (n2 and n3=1) interposed therebetween. The conventional solid-state image sensing device 2 is made so that a transparent substrate (n4=1.52) similar to the transparent substrate 9 of the first embodiment is placed over microlenses similar to the microlenses 6 of the first embodiment while a resin material layer (n2=1.41; which is provided as an antireflection film) similar to the fluorine-containing resin material layer 7 of the first embodiment and an air space (n3=1) are interposed between the microlens and the substrate.

If, as shown in FIG. 5, n1>1.60 and n2<1.45, the light collection ability of the microlens 6 can be maintained sufficiently. Therefore, light passing through the microlens 6 can be efficiently guided to the photodiode 2.

Moreover, in the first embodiment, as exemplarily shown in FIG. 3B, the top surface of the fluorine-containing resin material layer 7 is prevented from being curved in accordance with the curved surfaces of the microlenses 6. With this structure, even if n2<n3 (the solid-state image sensing devices 2 and 3 of the present invention), light 11 can be collected efficiently into the photodiode 2. In contrast to this, in the case where, as shown in FIG. 3A, the top surface of the fluorine-containing resin material layer 7 is curved in accordance with the curved surfaces of the microlenses 6, if n2<n3, light 11 coming from the resin layer 8 into the fluorine-containing resin material layer 7 disperses at the time of the incoming. As a result, the light 11 cannot be guided efficiently to the photodiode 2. Preferably, the top surface of the fluorine-containing resin material layer 7 is ideally flat. However, if the unevenness of the uppermost surface of the fluorine-containing resin material layer 7 (see FIG. 4) has a difference in level of about 300 nm or the smaller, the properties of the solid-state image sensing element as substantially identical as the case where the fluorine-containing resin material layer 7 is flat can be provided.

With the above-described solid-state image sensing device of the first embodiment (for example, "the solid-state image sensing devices 1 to 3 of the present invention" shown in FIG. 5), as shown in FIG. 6, it has been recognized that as compared to the conventional solid-state image sensing device (see FIG. 15), the sensitivity of the detected voltage is improved by about 10%.

Figure 16:
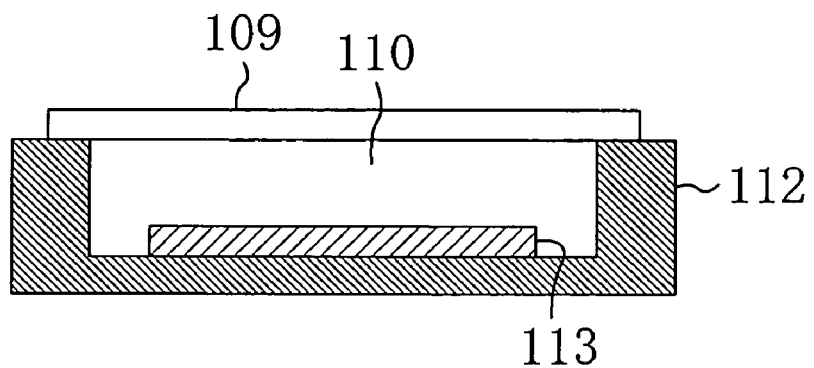
FIG. 16 is a sectional view of the conventional solid-state image sensing device.

Furthermore, with the solid-state image sensing device of the first embodiment, vertical downsizing (reduction in height) by about 0.5 to 5.0 mm can be attained as compared to the conventional solid-state image sensing device (see FIG. 16).

In the first embodiment, since the fluorine-containing resin material layer 7 is formed by spin coating, the fluorine-containing resin material layer 7 can be formed on the microlenses 6 before a wafer with the solid-state image sensing elements built thereon is separated (diced) into individual solid-state image sensing elements. This offers the following effects. That is to say, in general, the properties of the solid-state image sensing device depend greatly on the optical properties of the microlenses and a layer formed immediately above. However, if the fluorine-containing resin material layer 7 can be formed before dicing, intermediate inspections of the individual solid-state image sensing elements can be carried out before the transparent substrates are placed over the respective solid-state image sensing elements made by dicing the wafer. Therefore, based on the results of the inspections, a subsequent formation of the resin layer 8 and a later placement of the transparent substrate 9 can be made only to conforming solid-state image sensing elements. This greatly reduces fabrication costs, so that the first embodiment is very useful.

Furthermore, in the first embodiment, since the thickness of the resin layer 8 having the third refractive index n3 is set at 2 μm or more, the total thickness of organic material layers (the total thickness of the resin layer 8, the fluorine-containing resin material layer 7, the microlens 6, the second acrylic flattening film 5, the color filter 4, and the first acrylic flattening film 3) through which the light 11 coming from the transparent substrate 9 passes to reach the photodiode 2 can be set at 5 μm or greater. Thus, α-ray coming from outside the device is fully absorbed in those organic material layers, so that the necessity to subject the transparent substrate 9, that is, glass to processing for taking measures against α-ray is eliminated. This results in a further decrease in fabrication costs.

As described above, in the first embodiment, as shown in FIGS. 1, 3, and 5, the amount of light reaching the microlenses 6 can be further increased as compared to the amount of light in the conventional solid-state image sensing device, and concurrently the light 11 having reached the microlens 6 can be efficiently guided to the photodiode 2. Therefore, a solid-state image sensing device with a high sensitivity can be provided. Moreover, the occurrence of defects resulting from dust or the like can be prevented and a more increasing downsizing can be attained than the conventional example. Furthermore, processing for taking measures against α-ray does not have to be taken and intermediate inspections of the solid-state image sensing element including the components greatly affecting optical properties of the device can be carried out before dicing into individual devices. Therefore, a downsized solid-state image sensing device with high sensitivity can be provided stably at low cost.

It goes without saying that exemplary applications of the present invention are not limited to the embodiment described above. For example, in the first embodiment, acrylic resin is used for the flattening films 3 and 5. However, the material for the flattening film is not limited to acrylic resin as long as a material to be used is a heat-resistant resin with high transmissivity to visible light.

In the first embodiment, as the material for the color filter 4, use may be made of, for example, photosensitive resist containing pigment or dye. Alternatively, the color filter 4 may be formed by etching non-photosensitive resist containing pigment or dye. The color of pigment or dye to be used may be complementary color or primary color.

In the first embodiment, as the material for the microlens 6, use is made of styrene-based positive type resist employing a derivative of naphthoquinone diazide for a photosensitive agent. However, the material for the microlens 6 is not limited to this styrene-based positive type resist. In this regard, positive type resist used as an alternative to this styrene-based positive type resist must satisfy the following five conditions: (1) good adhesion to the underlying flattening film; (2) the ability to form a fine pattern by selective exposure; (3) the ability to enhance visible-light-range transmissivity by exposure to have a value of 80% or more; (4) the ability of thermal treatment to alter the shape of the resist due to thermoplasticity and simultaneously to fix it due to thermosetting property, thereby determining the final shape by the difference between the extents of their changes; and (5) good reliability of thermal resistance, solvent resistance, and the like. As exposure light used in the step of exposing positive type resist that will be the microlens 6, use may be made of ultraviolet ray or visible ray, specifically, i-line, g-line, h-line, or mixed ray of the listed ray. Alternatively, ultraviolet ray having another wavelength different from i-line, g-line, and h-line or electron ray may be used. The microlens may be formed using a pattern transfer process by etch back, or using a grayscale mask. Further, for example, metal oxide particles with a diameter of about 400 nm or smaller may be dispersed in the microlens 6.

Second Embodiment

Hereinafter, a solid-state image sensing device and its fabrication method according to a second embodiment of the present invention will be described with reference to the accompanying drawings. The second embodiment differs greatly from the first embodiment in that before formation of a resin layer, a spacer for defining the thickness of the resin layer is disposed around a light receiving area (a pixel area). This facilitates definition of the thickness of the resin layer serving as a layer for adhering a fluorine-containing resin material layer, that is, a semiconductor substrate and a transparent substrate.

FIGS. 7A to 7F and 8A to 8D are sectional views showing process steps of the method for fabricating a solid-state image sensing device according to the second embodiment. Note that overlapping description of the components of the solid-state image sensing device shown in FIGS. 7A to 7F and 8A to 8D which are the same as those in the first embodiment shown in FIGS. 1 and 2A to 2F and the like will be omitted by retaining the same reference numerals as the first embodiment.

Figure 7A:
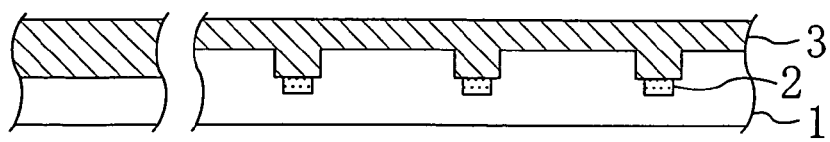
FIGS. 7A to 7F are sectional views showing process steps of a method for fabricating a solid-state image sensing device according to a second embodiment of the present invention.

Referring to FIG. 7A, first, a substrate 1 for a solid-state image sensing element is prepared which is made of a semiconductor substrate or the like. In a predetermined pixel area of the substrate 1, a plurality of photodiodes 2 are formed on the respective pixels. Subsequently, for example, acrylic resin is applied by spin coating to the entire surface of the substrate 1 for the solid-state image sensing element, and then the applied resin is heated and dried, for example, at about 180 to 250° C. and for about 60 to 600 seconds, thereby forming a first acrylic flattening film 3.

Figure 7B:
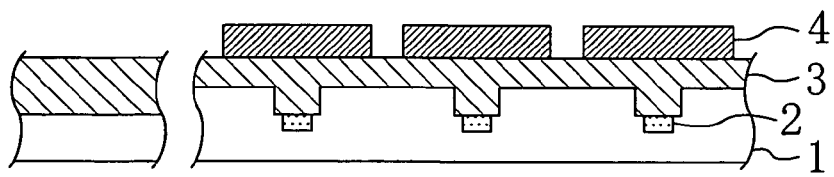

Next, as shown in FIG. 7B, on the first acrylic flattening film 3, the color filters 4 are formed to be associated with the photodiodes 2, respectively.

Figure 7C:
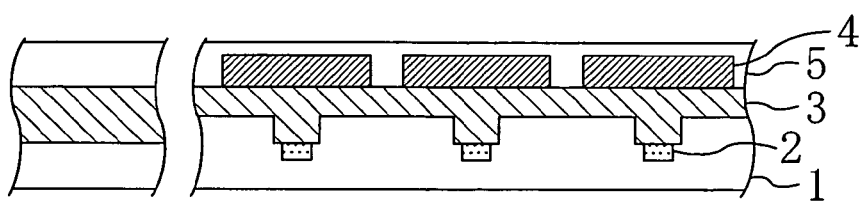

As shown in FIG. 7C, to the entire surfaces of the substrate 1 for the solid-state image sensing element including the top of the color filters 4, for example, acrylic resin is applied by spin coating to fill unevenness generated due to the color filters 4. Then, the applied resin is heated and dried, for example, at about 180 to 250° C. and for about 60 to 600 seconds. In the second embodiment, such application and dry steps are repeatedly conducted, for example, twice to eight times to form a second acrylic flattening film 5 with a high flatness.

Figure 7D:
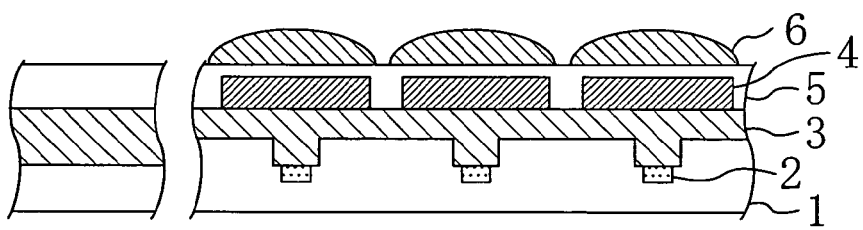

Like the step shown in FIG. 2D of the first embodiment, as shown in FIG. 7D, microlenses 6 are formed on the second acrylic flattening film 5 to be associated with the photodiodes 2, respectively.

Figure 7E:
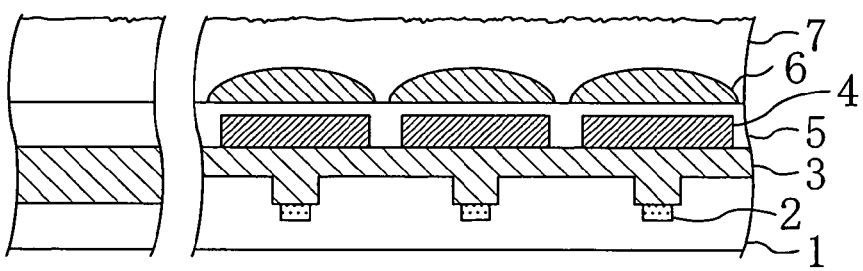

Like the step shown in FIG. 2E of the first embodiment, as shown in FIG. 7E, a fluorine-containing resin material layer 7 is formed on the entire surface of the second acrylic flattening film 5 with the microlenses 6 provided thereon, and then like the first embodiment, the surface of the fluorine-containing resin material layer 7 is subjected to plasma treatment.

Figure 7F:
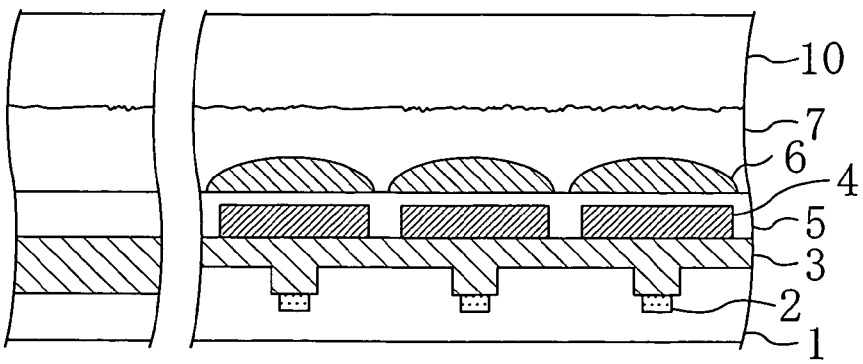
Figure 8A:
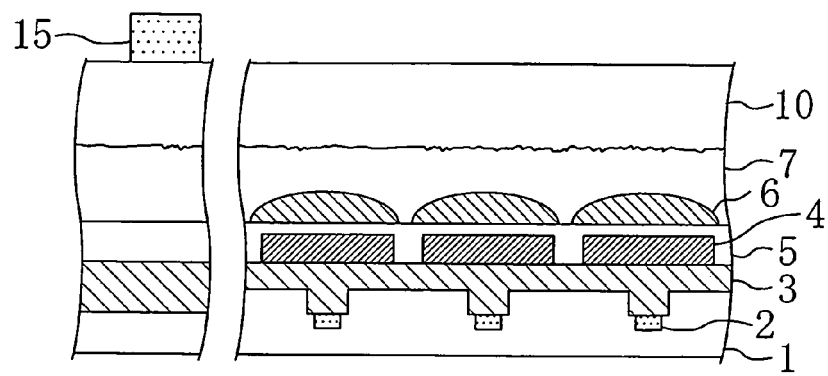
FIGS. 8A to 8D are sectional views showing process steps of the method for fabricating a solid-state image sensing device according to the second embodiment of the present invention.
Figure 8B:
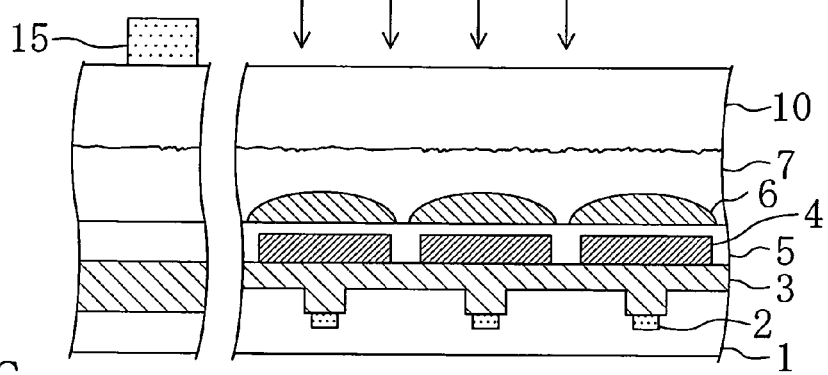
Figure 8C:
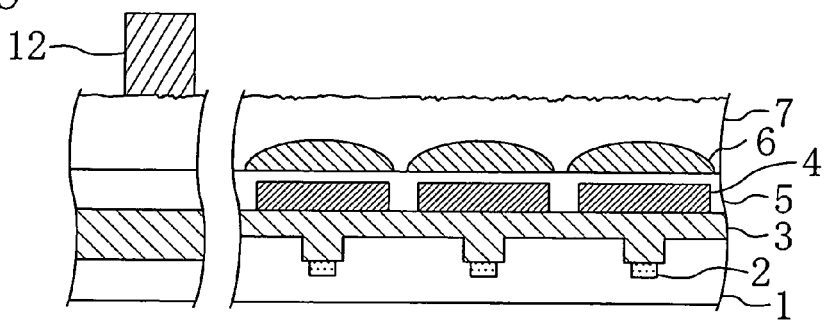
Figure 9:
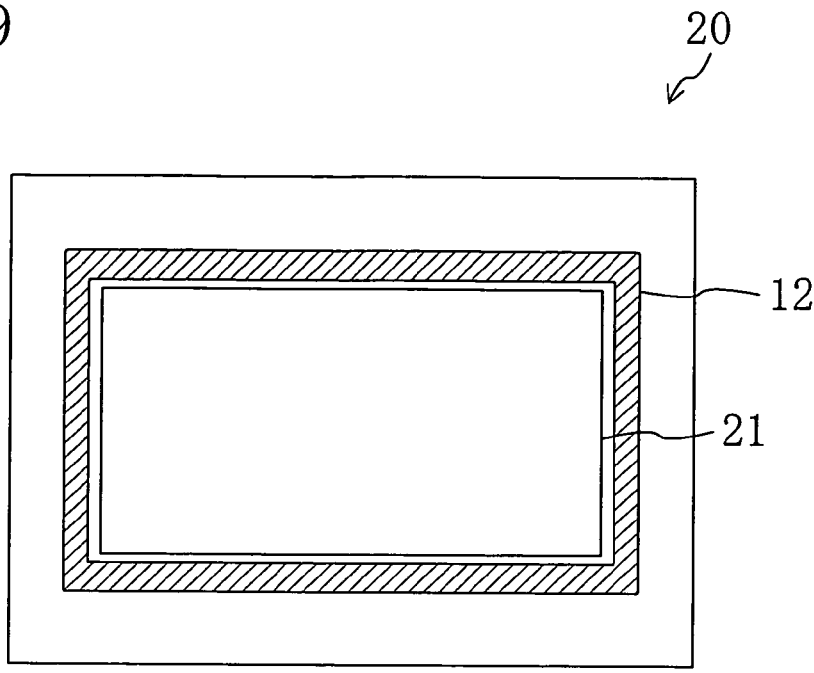
FIG. 9 is a plan view showing an exemplary arrangement of a spacer in the solid-state image sensing device according to the second embodiment of the present invention.

Next, as shown in FIG. 7F, an inorganic material layer 10 of, for example, SiN or $SiO_2$ is formed on the entire surface of the fluorine-containing resin material layer 7. Subsequently, as shown in FIG. 8A, a resist pattern 15 covering a spacer formation region located around the pixel area is formed on the inorganic material layer 10. Thereafter, as shown in FIG. 8B, using the resist pattern 15 as a mask, the inorganic material layer 10 is dry etched with a plasma made of a predetermined etching gas. With this process, as shown in FIG. 8C, a spacer 12 is formed on a portion of the fluorine-containing resin material layer 7 located around the pixel area. In this embodiment, the spacer 12 has a predetermined height for determining the thickness of a resin layer that will be described later. FIG. 9 is a plan view exemplarily showing how the spacer 12 is arranged around a pixel area 21 in a solid-state image sensing device 20 of the second embodiment.

Figure 8D:
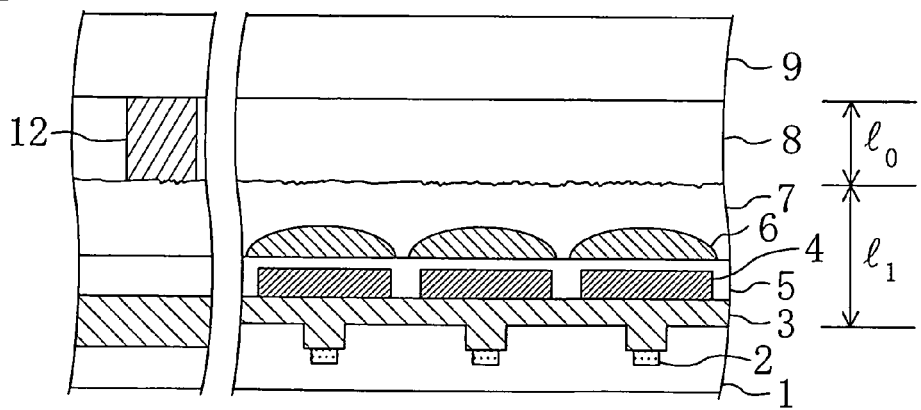

As shown in FIG. 8D, to the fluorine-containing resin material layer 7 formed with the spacer 12, resin is applied to have a thickness of, for example, 2 μm or greater, thereby forming the resin layer 8. Then, in order to protect the solid-state image sensing element composed of the photodiodes 2, the color filters 4, the microlenses 6, and the like, a transparent substrate 9 is placed on the resin layer 8. During this process, the resin layer 8 is cured to adhere the transparent substrate 9 and the fluorine-containing resin material layer 7, that is, the substrate 1 for the solid-state image sensing element. The thickness of the resin layer 8 is defined by the height of the spacer 12.

Also in the second embodiment, like the first embodiment, the thickness of the resin layer 8 indicates, as exemplarily shown in FIG. 4, the thickness D2 of the resin layer 8 vertically extending on the top point (the highest position) of the microlens 6.

With the second embodiment described above, the following effects can be offered in addition to the same effects as the first embodiment. To be more specific, since the thickness of the resin layer 8 is defined by the height of the spacer 12 arranged around the pixel area, the thickness of the resin layer 8 can be controlled to a desired value. Thus, for example, a thickened resin layer 8 can attenuate α-ray, so that expensive, high-purity glass for α-ray attenuation does not have to be used as the transparent substrate 9. Consequently, fabrication costs can be reduced.

In the second embodiment, the spacer 12 is formed by using an inorganic material as the material for the spacer 12 to subject the inorganic material to dry etching. Instead of this, photosensitive resin or the like may be used as the material for the spacer 12. To be more specific, the spacer 12 made of resin may be formed by applying photosensitive resin onto the fluorine-containing resin material layer 7 and then sequentially subjecting the photosensitive resin to exposure and development. With such a procedure, the spacer 12 can be formed easily after completion of the solid-state image sensing element composed of the photodiodes 2, the color filters 4, the microlenses 6, and the like (that is, after formation of the element on the chip).

In the second embodiment, the spacer 12 is formed on the fluorine-containing resin material layer 7. Instead of this, the spacer 12 may be formed on the second acrylic flattening film 5 by arranging a spacer formation region in a region where the fluorine-containing resin material layer 7 is not provided, the spacer 12 may be formed on the first acrylic flattening film 3 by arranging a spacer formation region in a region where the fluorine-containing resin material layer 7 and the second acrylic flattening film 5 are not provided, or the spacer 12 may be formed on the substrate 1 for the solid-state image sensing element by arranging a spacer formation region in a region where the fluorine-containing resin material layer 7, the second acrylic flattening film 5, and the first acrylic flattening film 3 are not provided. Such a structure can arrange the spacer 12 in a location sufficiently away from the pixel area, that is, the light-receiving surface, so that adhesion of the transparent substrate 9 larger than the light-receiving surface is facilitated.

In the second embodiment, the height of the spacer 12 with reference to the top surface of the fluorine-containing resin material layer 7 is set at $l_0$ [μm], and the thickness from the top surface of the substrate 1 for the solid-state image sensing element, that is, from the top surface of the semiconductor substrate to the top surface of the fluorine-containing resin material layer 7, that is, the bottom end of the spacer 12 is set at $l_1$ [μm]. In such a setting, it is preferable to satisfy the relation: $l_0 > 10 \, \mu m - l_1$. With this relation, even in the case where inexpensive glass poorly contributing to α-ray attenuation is used for the transparent substrate 9, a resin whose thickness from the top surface of the substrate to the top surface of the resin layer 8 is greater than 10 μm can attenuate α-ray sufficiently. As long as the relation described above is satisfied, in the case where the thickness $l_1$ from the top surface of the substrate to the top surface of the fluorine-containing resin material layer 7 (the bottom end of the spacer 12) is more than 8 μm, the height $l_0$ of the spacer 12, that is, the thickness of the resin layer 8 may be less than, for example, 2 μm.

Figure 10:
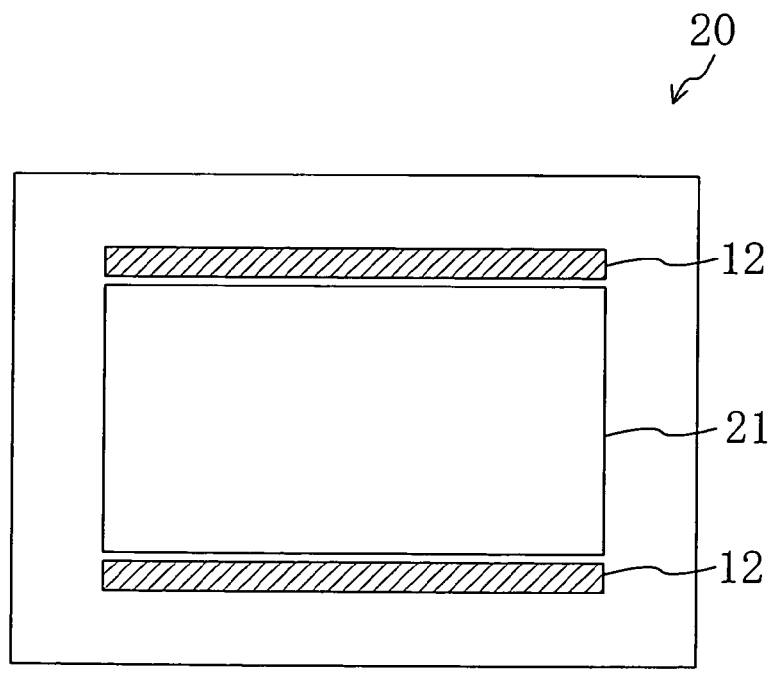
FIG. 10 is a plan view showing an exemplary arrangement of a spacer in the solid-state image sensing device according to the second embodiment of the present invention.
Figure 11:
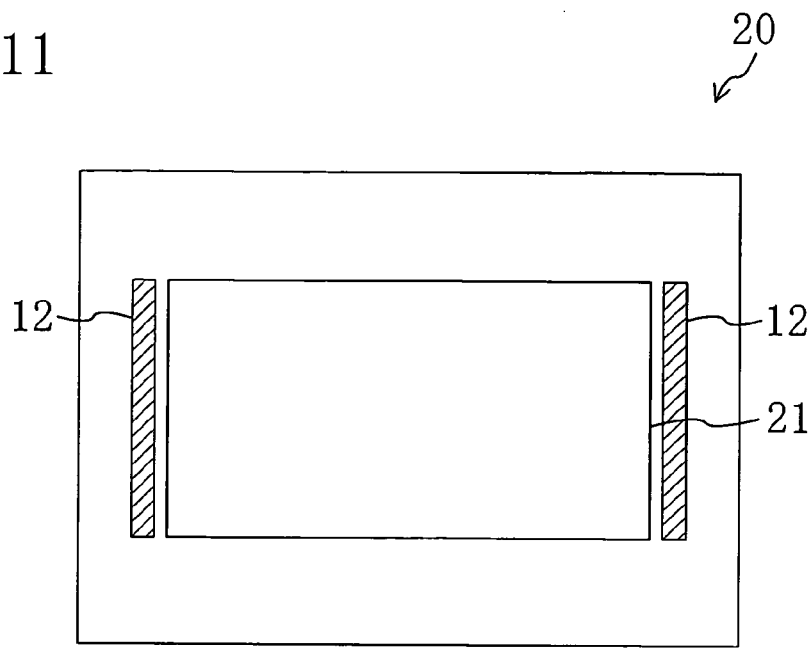
FIG. 11 is a plan view showing an exemplary arrangement of a spacer in the solid-state image sensing device according to the second embodiment of the present invention.

In the second embodiment, if, for example, the plan shape of the pixel area is set to be quadrangular, the spacer 12 is preferably provided along at least two facing sides of the pixel area 21 of the solid-state image sensing device 20 of the second embodiment, as exemplarily shown in FIGS. 10 and 11. This enables arrangement of the transparent substrate 9 in parallel with the pixel area 21, that is, the image sensing surface. With this arrangement, in mounting the solid-state image sensing device 20 of the second embodiment in a camera or the like, components can be installed using the top surface of the transparent substrate 9 as the reference level. Therefore, the number of components installed between the reference level and a lens decreases as compared to the case where a member serving as the reference level is attached to the back surface of the package like the conventional solid-state image sensing device (see, for example, Patent Document 5: Japanese Unexamined Patent Publication No. 2005-51518). This reduces deviation of position for installing the components to improve the accuracy of image sensing. Furthermore, the arrangement of the transparent substrate 9 in parallel with the pixel area 21, that is, the image sensing surface can certainly prevent color moiré, shading (non-uniform brightness), or the like.

Modification of Second Embodiment

Hereinafter, a solid-state image sensing device and its fabrication method according to a modification of the second embodiment of the present invention will be described with reference to the accompanying drawings. As compared to the second embodiment, a characteristic of this modification is that a spacer in the present invention is provided between a pixel area and an amplifier unit arranged around the pixel area, and that the spacer is provided with an opening not to face the amplifier unit.

Figure 12:
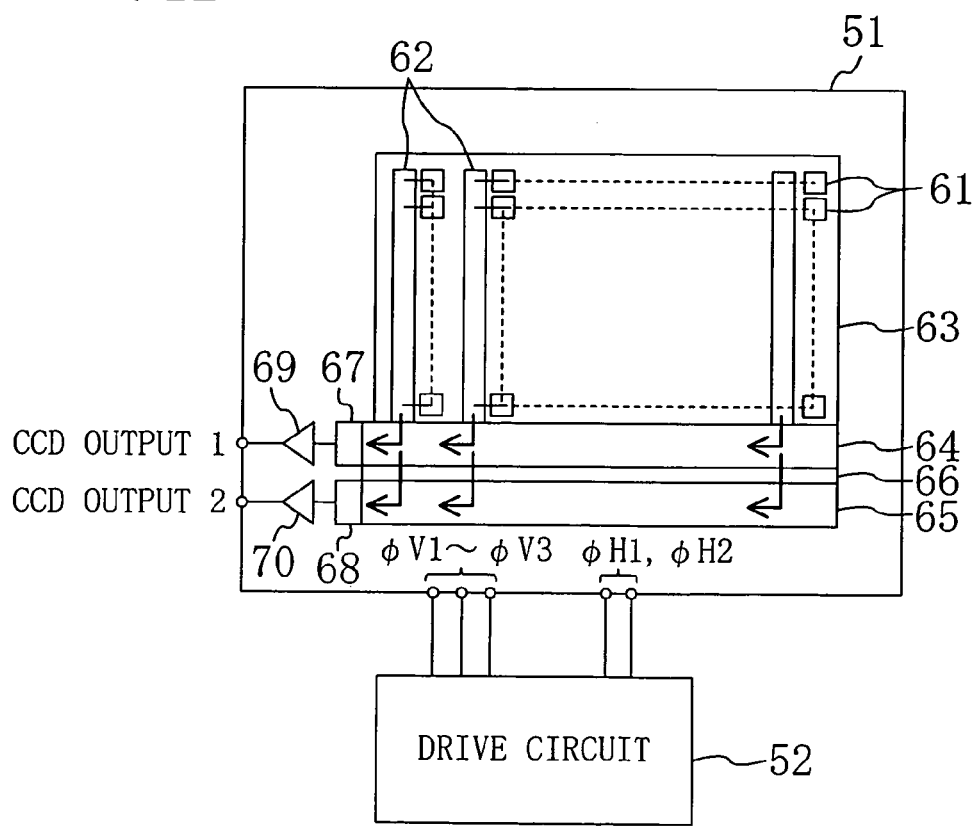
FIG. 12 is a block diagram showing an example of a schematic circuit structure of a solid-state image sensing device intended to apply a modification of the second embodiment of the present invention.

FIG. 12 exemplarily shows a schematic circuit structure of a solid-state image sensing device, specifically, an interline-transfer CCD solid-state image sensing device intended to apply this modification. As shown in FIG. 12, an image sensing region (pixel area) 63 of a CCD solid-state image sensing device 51 is composed of a plurality of light receiving units (photoelectric conversion units) 61 and a plurality of vertical transfer registers 62. The light receiving units 61 are arranged in the row direction (vertical direction) and in the column direction (horizontal direction), that is, in matrix form, and accumulate signal charges according to the amount of incoming light. The vertical transfer registers 62 are arranged on vertical lines of the light receiving units 61, respectively, and vertically transfer signal charges read out from the light receiving units 61. In the image sensing region 63, each of the light receiving units 61 is made of, for example, a pn junction photodiode, and each of the vertical transfer registers 62 is made of a CCD. In response to application of a charge readout pulse to a readout gate (not shown), signal charges accumulated in the light receiving unit 61 are read out to the vertical transfer register 62. The vertical transfer register 62 is driven for transfer by, for example, three-phase vertical transfer clocks φV1 to φV3 supplied from a drive circuit 52. Signal charges read out to the vertical transfer register 62 are vertically transferred by an amount corresponding to a single scanning line for part of the horizontal blanking period.

As shown in FIG. 12, in a region adjacent to the image sensing region 63, a first horizontal transfer register 64 and a second horizontal transfer register 65 are arranged in parallel with each other with a transfer gate 66 interposed therebetween. To the first and second horizontal transfer registers 64 and 65, signal charges corresponding to a single scanning line are sequentially transferred from the plurality of vertical transfer registers 62. The first and second horizontal transfer registers 64 and 65 are each made of a CCD. These two horizontal transfer registers 64 and 65 are driven for transfer by two-phase horizontal transfer clocks φH1 and φH2 supplied from the drive circuit 52, whereby signal charges with an amount of two lines are sequentially transferred horizontally for a horizontal scanning period after the horizontal blanking period. At ends of the horizontal transfer registers 64 and 65, charge detection units 67 and 68 are disposed which have, for example, floating diffusion structures, respectively. The two-channel signal charges having horizontally transferred are sequentially converted by the charge detection units 67 and 68 into voltage signals. This voltage signals are amplified by output amplifiers 69 and 70 which are connected to the horizontal transfer registers 64 and 65 through the charge detection units 67 and 68, respectively, and then the amplified signals are supplied from the CCD solid-state image sensing device 51 as two-channel CCD outputs 1 and 2 according to the amount of light incoming from a subject of the image. As described above, the non-interlaced (progressive scan type) CCD solid-state image sensing device 51 is constructed which is provided with the two-channel horizontal transfer registers 64 and 65.

Figure 13:
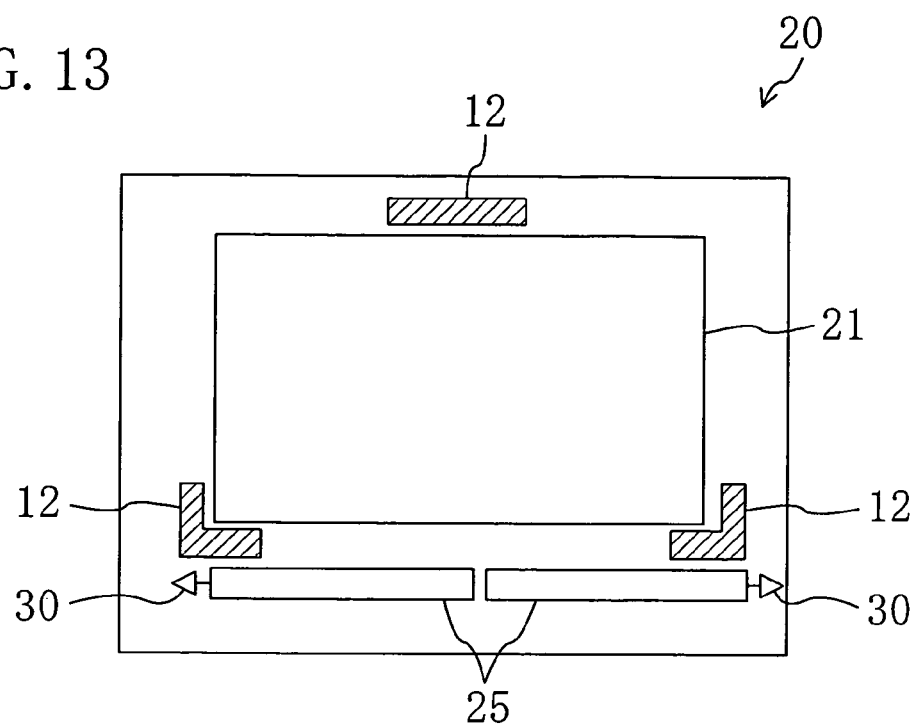
FIG. 13 is a plan view showing an exemplary arrangement of a spacer in a solid-state image sensing device according to a modification of the second embodiment of the present invention.

When this modification is targeted for a two-channel (two amplifiers) driven CCD solid-state image sensing device, as exemplary shown in FIG. 13, two horizontal transfer registers 25 and two amplifier units 30 connected to the horizontal transfer registers 25, respectively, are disposed around the pixel area 21 (where, for example, light receiving units and vertical transfer registers (not shown) are arranged) of the solid-state image sensing device 20 of this modification. In this device, the spacer 12 is provided at least between each of the amplifier units 30 and the pixel area 21, and the spacer 12 is provided with an opening not to face each of the amplifier units 30.

Figure 14:
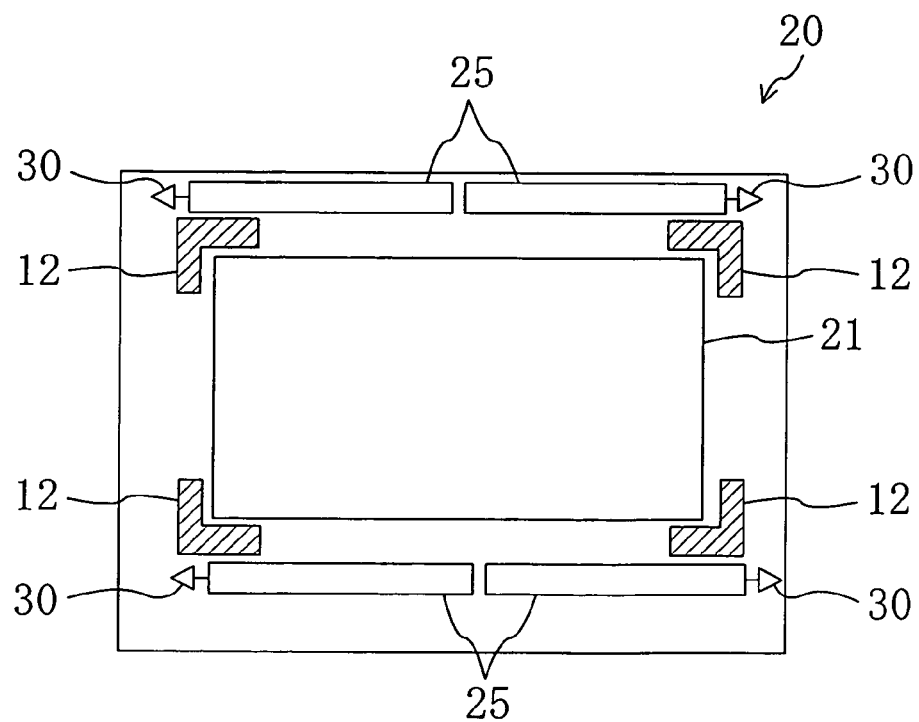
FIG. 14 is a plan view showing an exemplary arrangement of a spacer in a solid-state image sensing device according to a modification of the second embodiment of the present invention.

When this modification is targeted for a four-channel (four amplifiers) driven CCD solid-state image sensing device, as exemplary shown in FIG. 14, four horizontal transfer registers 25 and four amplifier units 30 connected to the horizontal transfer registers 25, respectively, are disposed around the pixel area 21 (where, for example, light receiving units and vertical transfer registers (not shown) are arranged) of the solid-state image sensing device 20 of this modification. In this device, the spacer 12 is provided at least between each of the amplifier units 30 and the pixel area 21, and the spacer 12 is provided with an opening not to face each of the amplifier units 30.

With this modification described above, the following effects can be offered in addition to the effects of the first and second embodiments. Specifically, the spacer 12 is provided between the amplifier unit 30 and the pixel area 21, and the spacer 12 is provided with an opening not to face the amplifier unit 30. Thereby, when to the fluorine-containing resin material layer 7, that is, to the substrate 1 for the solid-state image sensing element, the transparent substrate 9 is adhered with adhesive serving as the resin layer 8, the spacer 12 can block the adhesive applied to, for example, the pixel area 21 from being squeezed out to the amplifier unit 30. At the time of the blocking, the adhesive are squeezed out through the spacer opening, which is arranged not to face the amplifier unit 30, to the outside of the pixel area 21 (a region of the device where no amplifier unit 30 is arranged). This certainly prevents a decrease in amplifier sensitivity (lowering of amplifier sensitivity to about 3 to 10%) due to the adhesive attaching to the amplifier unit 30.

It goes without saying that in this modification, the drive system of the solid-state image sensing device is not specifically limited.

What is claimed is:

1. A solid-state image sensing device comprising:
a light receiving unit for receiving light;
a color filter formed above the light receiving unit;
a microlens formed above the color filter and having a first refractive index of n1;
a first material layer formed on the microlens and having a second refractive index of n2; and
a second material layer provided over the first material layer and having a fourth refractive index of n4,
wherein a third material layer adheres the first material layer and the second material layer and has a third refractive index of n3;
the following relations hold: n3=(n2+n4)/2±0.2 and n1>n2, and
the top surface of the first material layer has a first contour and the top surface of the microlens has a second contour, said first contour and said second contour being shaped differently in an area located above said microlens.

2. The device of claim 1, wherein the first material layer is a fluorine-containing resin layer.

3. The device of claim 1, wherein the following relations hold: n1>1.60 and n2<1.45.

4. The device of claim 1, wherein the microlens is made of styrene-based positive type resist.

5. The device of claim 1 further comprising:
a color filter formed between the light receiving unit and the microlens.

6. The device of claim 1, wherein the microlens contains naphthoquinone diazide.

7. The device of claim 1, wherein a thickness of the first material layer is equal to or more than 0.1 μm.

8. The device of claim 1, wherein the first material layer is made of acrylic-based resin.

9. The device of claim 1, wherein the first material layer is made of olefin-based resin.

10. The device of claim 1, wherein the first material layer is made of silicone-based resin.

11. The device of claim 1, wherein hollow microparticles of silicon dioxide having a diameter less than 400 nm is dispersed in the first material layer.

12. The device of claim 1, wherein hollow microparticles of metal oxide having a diameter less than 400 nm is dispersed in the first material layer.

13. The device of claim 1, wherein the third material layer has a thickness of 2 μm or greater.

14. The device of claim 1, wherein the third material layer is made of acrylic-based resin.

15. The device of claim 1, wherein the third material layer is made of epoxy resin.

16. The device of claim 1, wherein the second material layer is made of a glass.

17. The device of claim 1, further comprising a first flattening film on the light-receiving unit and under the microlens.

18. The device of claim 17, wherein the first flattening film is acrylic.

19. The device of claim 17, further comprising a color filter on the first flattening film and under the microlens.

20. The device of claim 19, further comprising a second flattening film on the color filter and under the microlens.

21. The device of claim 20, wherein the second flattening film is acrylic.

22. The device of claim 19, wherein the color filter is made of photosensitive resist containing pigment.

23. The device of claim 19, wherein the color filter is made of photosensitive resist containing dye.

24. The device of claim 19, wherein the color filter is formed by etching non-photosensitive resist containing pigment.

25. The device of claim 19, wherein the color filter is formed by etching non-photosensitive resist containing dye.

26. The device of claim 19, wherein the color filter is complementary color.

27. The device of claim 19, wherein the color filter is primary color.

28. The device of claim 1, wherein the first refractive index of n1 is 1.65.

29. The device of claim 1, wherein the second refractive index of n2 is 1.41.

30. The device of claim 1, wherein the third refractive index of n3 is 1.26.

31. The device of claim 1, wherein the third refractive index of n3 is 1.46.

32. The device of claim 1, wherein the third refractive index of n3 is 1.66.

33. The device of claim 1, wherein the forth refractive index of n4 is 1.52.

34. The device of claim 1, wherein the top surface of the first material layer is flat.

35. The device of claim 1, wherein an unevenness of the top surface of the first material layer is 300 nm or less.

36. A method for fabricating a solid-state image sensing device, comprising the steps of:
forming, above a light receiving unit for receiving light, a color filter;
forming, above the color filter, a microlens having a first refractive index of n1;
forming, on the microlens, a fluorine-containing resin material layer having a second refractive index of n2;
forming, on the fluorine-containing resin material layer, a resin layer having a third refractive index of n3; and
providing, on the resin layer, a transparent substrate having a fourth refractive index of n4;
wherein the following relations hold: $n3=(n2+n4)/2\pm0.2$ and n1>n2, and
the top surface of the fluorine-containing material layer has a first contour and the top surface of the microlens has a second contour, said first contour and said second contour being shaped differently in an area located above said microlens.

37. The method of claim 36, wherein the first material layer is formed by spin coating.

38. The method of claim 36, further comprising the step of subjecting the surface of the first material layer to oxygen plasma treatment.

39. The method of claim 36, wherein an unevenness of the top surface of the fluorine-containing material layer is 300 nm or less.

40. A solid-state image sensing device comprising:
a light receiving unit for receiving light;
a microlens formed above the light receiving unit and having a first refractive index of n1;
a first material layer formed on the microlens and having a second refractive index of n2; and
a second material layer provided over the first material layer and having a fourth refractive index of n4,
wherein a third material layer adheres the first material layer and the second material layer and has a third refractive index of n3;
the following relations hold: $n3=(n2+n4)/2\pm0.2$ and n1>n2, and
the top surface of the first material layer has a curve shape in an area located above said each microlens, a height of the each microlenses is greater than a height from a bottom of the curve shape to a top of the curve shape of the first material layer.

41. The device of claim 40, wherein the first material layer is a fluorine-containing resin layer.

42. The device of claim 40, wherein the following relations hold: n1>1.60 and n2<1.45.

43. The device of claim 40, wherein the microlens is made of styrene-based positive type resist.

44. The device of claim 40 further comprising:
a color filter formed between the light receiving unit and the microlens.

45. The device of claim 40, wherein the microlens contains naphthoquinone diazide.

46. The device of claim 40, wherein a thickness of the first material layer is equal to or more than 0.1 μm.

47. The device of claim 40, wherein the first material layer is made of acrylic-based resin.

48. The device of claim 40, wherein the first material layer is made of olefin-based resin.

49. The device of claim 40, wherein the first material layer is made of silicone-based resin.

50. The device of claim 40, wherein hollow microparticles of silicon dioxide having a diameter less than 400 nm is dispersed in the first material layer.

51. The device of claim 40, wherein hollow microparticles of metal oxide having a diameter less than 400 nm is dispersed in the first material layer.

52. The device of claim 40, wherein the third material layer has a thickness of 2 μm or greater.

53. The device of claim 40, wherein the third material layer is made of acrylic-based resin.

54. The device of claim 40, wherein the third material layer is made of epoxy resin.

55. The device of claim 40, wherein the second material layer is made of a glass.

56. The device of claim 40, further comprising a first flattening film on the light-receiving unit and under the microlens.

57. The device of claim 56, wherein the first flattening film is acrylic.

58. The device of claim 56, further comprising a color filter on the first flattening film and under the microlens.

59. The device of claim 58, further comprising a second flattening film on the color filter and under the microlens.

60. The device of claim 58, wherein the color filter is made of photosensitive resist containing pigment.

61. The device of claim 58, wherein the color filter is made of photosensitive resist containing dye.

62. The device of claim 58, wherein the color filter is formed by etching non-photosensitive resist containing pigment.

63. The device of claim 58, wherein the color filter is formed by etching non-photosensitive resist containing dye.

64. The device of claim 58, wherein the color filter is complementary color.

65. The device of claim 58, wherein the color filter is primary color.

66. The device of claim 40, wherein the second flattening film is acrylic.

67. The device of claim 40, wherein the first refractive index of n1 is 1.65.

68. The device of claim 40, wherein the second refractive index of n2 is 1.41.

69. The device of claim 40, wherein the third refractive index of n3 is 1.26.

70. The device of claim 40, wherein the third refractive index of n3 is 1.46.

71. The device of claim 40, wherein the third refractive index of n3 is 1.66.

72. The device of claim 40, wherein the forth refractive index of n4 is 1.52.

73. The device of claim 40, wherein the top surface of the first material layer is flat.

74. The device of claim 40, wherein an unevenness of the top surface of the first material layer is 300 nm or less.

* * * * *